United States Patent [19]

Beilstein, Jr. et al.

[11] 4,276,095
[45] Jun. 30, 1981

[54] METHOD OF MAKING A MOSFET DEVICE WITH REDUCED SENSITIVITY OF THRESHOLD VOLTAGE TO SOURCE TO SUBSTRATE VOLTAGE VARIATIONS

[75] Inventors: Kenneth E. Beilstein, Jr.; Harish N. Kotecha, both of Manassas, Va.

[73] Assignee: International Business Machines Corporation, Armonk, N.Y.

[21] Appl. No.: 19,797

[22] Filed: Mar. 12, 1979

Related U.S. Application Data

[63] Continuation of Ser. No. 829,393, Aug. 31, 1977, abandoned.

[51] Int. Cl.³ .................. H01L 29/78; H01L 21/26
[52] U.S. Cl. ............................ 148/1.5; 148/187; 357/23; 357/91
[58] Field of Search .............. 148/1.5, 187; 357/23, 357/91

[56] References Cited

U.S. PATENT DOCUMENTS

| | | | |
|---|---|---|---|
| 3,383,567 | 5/1968 | King et al. | 317/234 |
| 3,789,504 | 2/1974 | Jaddam | 29/571 |
| 3,814,992 | 6/1974 | Kump et al. | 357/23 |
| 3,891,468 | 6/1975 | Ito et al. | 148/1.5 |
| 3,895,966 | 7/1975 | McDougall et al. | 148/1.5 |
| 4,021,835 | 5/1977 | Etoh et al. | 357/23 |
| 4,078,947 | 3/1978 | Johnson et al. | 148/1.5 |
| 4,108,686 | 8/1978 | Jacobus, Jr. | 148/1.5 |
| 4,132,998 | 1/1979 | Dingwall | 357/23 |
| 4,143,386 | 3/1979 | Kaiser | 357/22 |
| 4,145,233 | 3/1979 | Sefick et al. | 148/1.5 |

OTHER PUBLICATIONS

Fisher et al., Solid State Electronics, 22 (1979) 225.

*Primary Examiner*—L. Dewayne Rutledge
*Assistant Examiner*—Upendra Roy
*Attorney, Agent, or Firm*—Maurice H. Klitzman

[57] ABSTRACT

A MOSFET device structure is disclosed where the channel region has formed therein a buried layer of dopant of the same conductivity type as the source and drain, so that the depletion layers for the PN junctions at the upper and lower boundaries thereof intersect in the middle of the implanted region, effectively forming a buried insulator layer between the source and drain. The presence of this layer increases the distance between the mirrored electrostatic charges in the gate and in the bulk of the substrate beneath the MOSFET, thereby reducing the sensitivity of the threshold voltage of the device to variations in the source to substrate voltage.

1 Claim, 8 Drawing Figures 4,276,095

METHOD OF MAKING A MOSFET DEVICE WITH REDUCED SENSITIVITY OF THRESHOLD VOLTAGE TO SOURCE TO SUBSTRATE VOLTAGE VARIATIONS

This is a continuation of application Ser. No. 829,393, filed Aug. 31, 1977, now abandoned.

FIELD OF THE INVENTION

The invention disclosed generally relates to semiconductor devices and more particularly relates to MOSFET devices.

BACKGROUND OF THE INVENTION

The efficiency of a MOSFET logic circuit depends upon its current driving capability. The current drive in turn depends upon the device threshold voltage which is a function of the source to substrate voltage difference. Because the source voltage varies during certain circuit applications such as ungrounded sources, the source to substrate voltage varies. As a result, the threshold voltage varies so that the current drive capability of the device is modified. The problem is to make the threshold less sensitive to changes in the source to substrate voltage of the device. The rate of change of threshold voltage with respect to the source to substrate voltage is commonly referred to as the substrate sensitivity of the device. Substrate sensitivity is a function of factors like oxide thickness, doping in the background, dielectric constant, etc. Thus an objective has been to reduce the variations in threshold voltage during device operation by reducing the substrate sensitivity resulting in improved current drive capability.

Various prior art attempts have been made to improve substrate sensitivity. For example, one alternative considered was to use high resistivity substrates by uniformally altering substrate dopant concentration because it was also thought to give better capacitance. However, when using high resistivity substrates, inherently problems of density resulting from short channel effects, punch-through, etc. are created. When the over all background conductivity is reduced, inversion may result in the field regions causing circuit malfunction. Although there are some gains attained by using high resistivity substrates, a significantly large amount of the gain is offset by the inherent problems.

Another attempt to achieve lower substrate sensitivity is substrate isolation by separating the substrate for each device. The cost of fabrication becomes excessive because of complex processes needed such as double diffusion and doping two different regions. Also, there is a loss in density inherent in isolating any device.

It is known to double ion-implant in the channel region of an FET device to move an implanted depletion mode load type junction toward the surface of the channel to solve the problem of a depletion mode device which cannot otherwise be controlled or turned-off. This is accomplished by double ion-implanting materials of opposite type to yield an abrupt junction. However, substrate sensitivity reduction does not necessarily occur simply by ion-implantation.

OBJECTS OF THE INVENTION

It is an object of the invention to reduce the sensitivity of the threshold voltage of a MOSFET device to source to substrate voltage variations in an improved manner.

SUMMARY OF THE INVENTION

This and other objects, features and advantages of the invention are provided by the MOSFET device with reduced threshold voltage sensitivity disclosed herein.

A MOSFET device structure is disclosed where the channel region has formed therein a buried layer of dopant of the same conductivity type as the source and drain, which is optimized so that the depletion layers for the PN junctions at the upper and lower boundaries thereof merge in the middle of the buried layer, effectively forming a buried insulator layer between the source and drain. The presence of this layer has the effect of increasing the distance between the mirrored electrostatic charges in the gate and in the bulk of the substrate beneath the MOSFET channel region, thereby reducing the sensitivity of the threshold voltage for the device to variations in the source to substrate voltage.

DESCRIPTION OF THE FIGURES

These and other objects, features and advantages of the invention will be more fully appreciated with reference to the accompanying drawings.

DISCUSSION OF THE PREFERRED EMBODIMENT

Figure 1A:
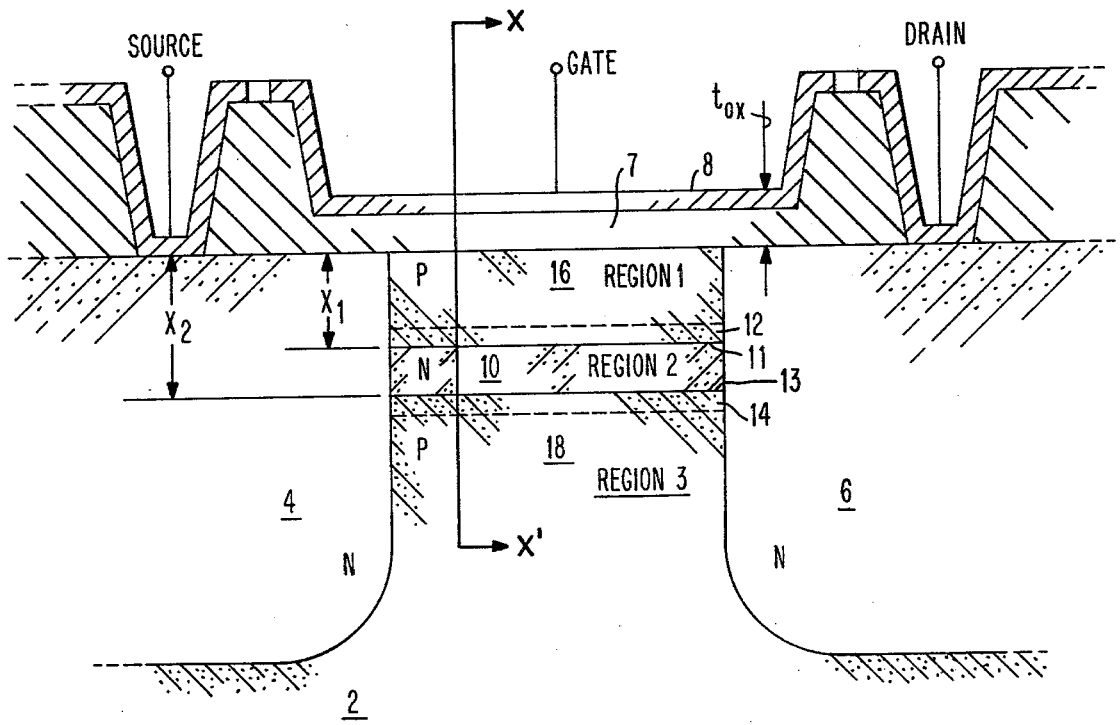
FIG. 1A is a cross sectional view of a structure containing the invention.

The electrostatic cross talk between the substrate and the gate of an FET device can be reduced by introducing an insulating layer of a predetermined thickness and depth beneath the surface of the substrate in the channel region so that the distance, between the gate and the electrostatic charges within the bulk of the substrate which mirror the (effective) charges on the gate, is effectively increased. Since the potential difference between the gate and the mirror charges in the bulk is directly proportional to the electrostatic field strength times the distance therebetween, if the distance is increased for the same field strength, the potential difference is increased. By adding one more charge to the gate, the net increase in potential within the substrate necessary to maintain charge equilibrium becomes greater, with an increasing thickness of the insulating layer. Thus it is seen that the effect on the gate potential, resulting from variations in the substrate potential, i.e., electrostatic cross talk, is diminished as the distance between the mirrored charges is increased by virtue of the introduction of the buried insulating layer.

Given that the gate has imposed on it a potential just sufficient to start conduction between the source and the drain, i.e., the gate voltage is equal to the threshold voltage, a given magnitude of voltage perturbation in the source to substrate voltage will have a lesser effect on actually inducing conduction in the channel region, when the intervening insulating layer is thicker, i.e., when there is a greater separation distance between the mirrored charges in the bulk of the substrate and in the gate. Thus by introducing an insulating layer of given thickness at a desired depth beneath the surface of the substrate in the channel region, the effect of variations in the substrate potential on the threshold voltage of the device, is reduced.

A preferred method for introducing an insulating layer is by ion implanting a doped layer 10 of source/drain N-type conductivity dopant at a predetermined depth from $X_1$ to $X_2$ below the substrate surface in the channel region in FIG. 1A. As a result, two PN junctions are formed, an upper PN junction 11 and a lower PN junction 13, with the surrounding P-type material of the substrate 2. As in all PN junctions, a depletion region is formed around the junction region. The thickness and concentration of the implanted layer 10 is optimized so that the depletion region 12 for the upper PN junction 11 and the depletion region 14 for the lower PN junction 13 merge such that the region 10 therebetween is substantially an insulating region. Therefore, a buried insulating layer 10 such as is desired to reduce the sensitivity of the threshold voltage to the source to substrate voltage, as was discussed above, may be introduced by ion implanting the source/drain conductivity type layer 10 in the channel region.

Figure 3:
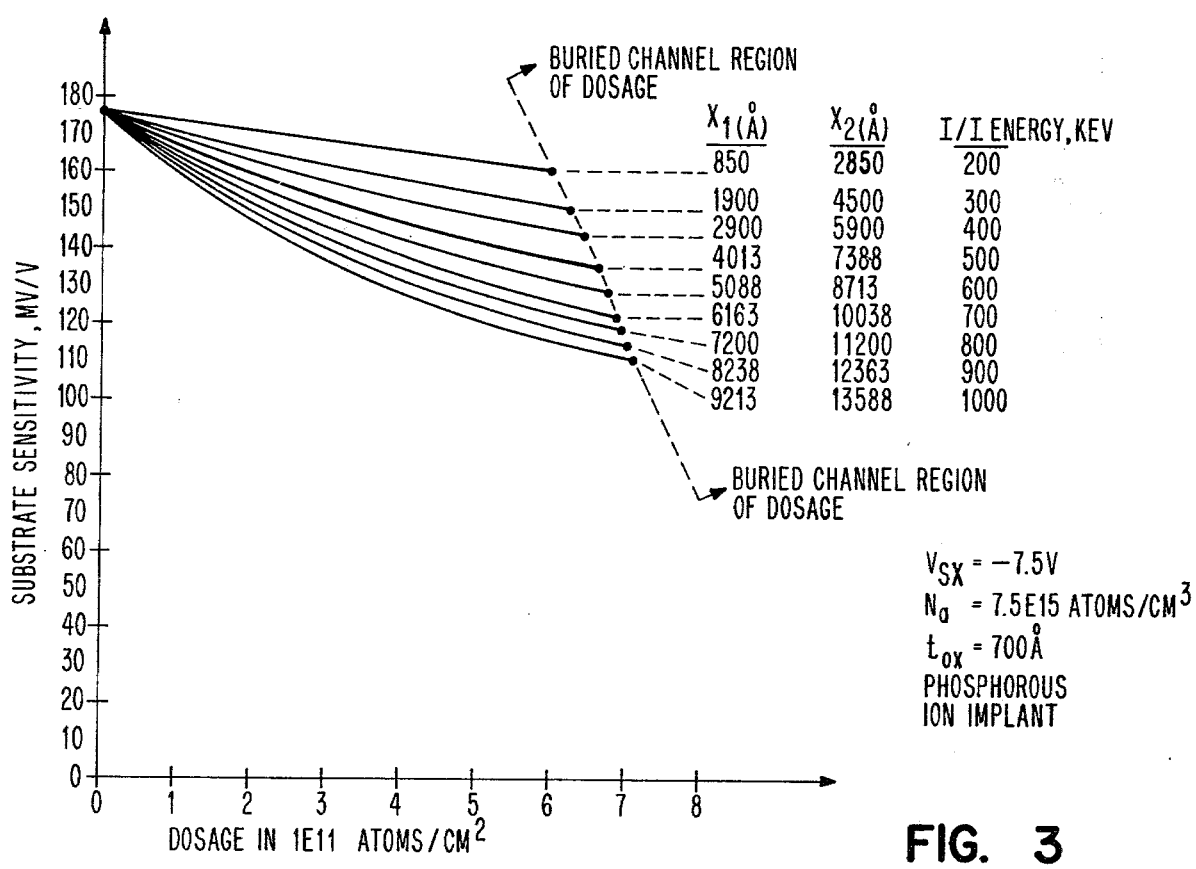
FIG. 3 is a graphical representation of the substrate sensitivity in millivolts per volt as a function of the deep implant dosage for various implant energies for the inventive device.

It is noted that if the buried dopant layer 10 has a concentration too high with respect to the concentration of the background dopant for the substrate 2, an electrically shorted condition can occur between the source 4 and the drain 6. But if the concentration of the buried dopant layer 10 is too low, it will have a vanishing effect on the sensitivity of the threshold voltage to the source to substrate voltage. It has been found there are critical values for the depth $X_1$ of the dopant layer 10 beneath the surface of the substrate 2, the thickness $(X_2-X_1)$ of the dopant layer 10 and the concentration thereof, within which a range of reduced sensitivities of the threshold voltage to the source to substrate voltage will be obtained. Some examples of these combinations of depth, thickness and concentration for the buried dopant layer 10 are shown in FIG. 3.

The following is an analysis of the threshold voltage equations with necessary boundary conditions for an N-channel MOSFET to obtain improved substrate sensitivity. For purposes of this analysis, the Gaussian distribution for the deep ion-implant is normalized to a rectangular shape with its width being 2.5 times the standard deviation of the spread of the ion-implant, the dosage, D, being the peak dosage. This approximation of the Gaussian distribution is done in a manner so as to conserve the implanted dosage. Although this analysis is made for N-channel devices, it is equally valid for P-channel devices with appropriate polarity changes.

Figure 1B:
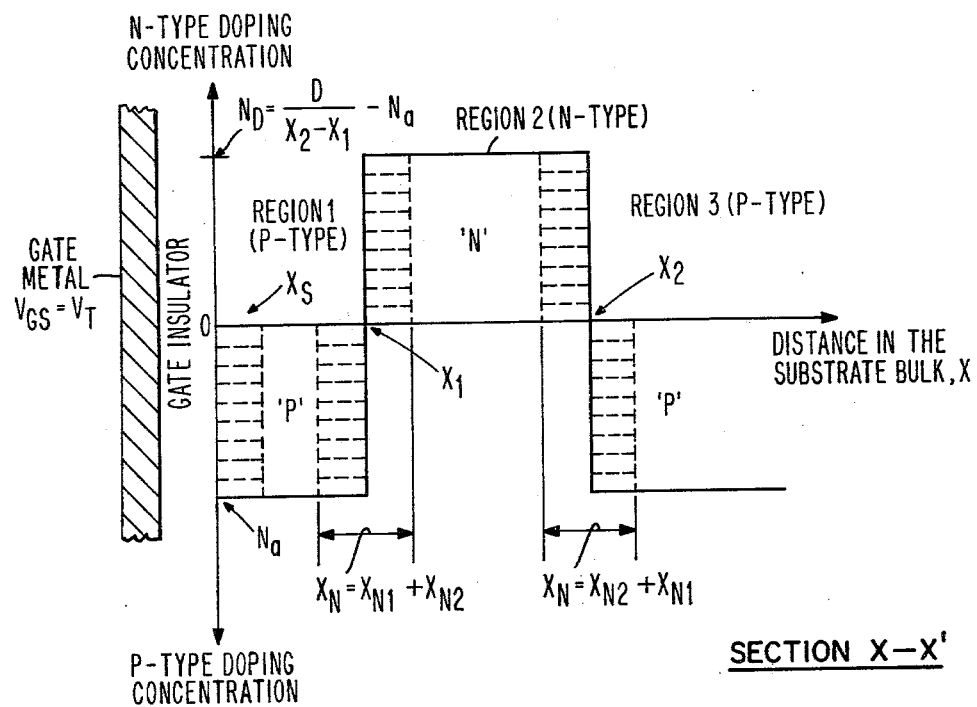
FIG. 1B is a doping profile along the section X—X' of FIG. 1A but rotated 90°.

FIG. 1B is a composite figure showing the doping profile superimposed over the channel region of FIG. 1A, from the gate insulator 7 down into the bulk 2 of the semiconductor. $N_a$ is the doping concentration of the semiconductor substrate 2. To begin the analysis in region 1 (also see FIG. 1A), it is assumed that the gate to source bias, $V_{GS}$, is equal to the device threshold voltage, and the substrate to source bias, $V_{SX}$, are such that the channel depletion layer immediately below the gate insulator in region 1 does not merge with depletion layer 12. In addition, it is assumed that the implant conditions are such that the depletion layers 12 and 14 do not merge, and as a result, the buried layer 10, otherwise referred to as region 2, shorts the source and drain diffusions 4 and 6. With this as a starting point, the condition for non-conductive or depleted region 2 is first developed.

Next is developed an expression for the critical substrate to source bias, $V_{sxc}$, whose magnitude, when exceeded, totally depletes the portion 16 of substrate 2, otherwise referred to as region 1, which together with depleted region 2, yields a device with improved substrate sensitivity. If the substrate bias, $V_{SX}$, is less than this critical value and region 2 is depleted, the device has a substrate sensitivity comparable to state of the art devices.

Now referring to region 2, the width of the depletion layers 12 and 14 on both sides is the same due to symmetry. If region 2 is to be depleted, then:

$$2X_{N2} \geq X_2 - X_1 \quad (1)$$

Since under this condition both sides 11 and 13 of region 2 are at the same potential, the depletion layers 12 and 14 are sustained only by the built-in voltage across the PN diodes. It is well known from the theory of step junctions that:

$$2X_N = 2\sqrt{\frac{2\epsilon_0\epsilon_S N_a V_J}{q(N_a + N_D)N_D}} \quad (2)$$

where
$\epsilon_0$ is the permittivity in free space,
$\epsilon_S$ is the dielectric constant of the semiconductor material and
q is the electronic charge
$V_J$ is the built-in voltage across the depletion region 12 or 14.

To completely deplete region 2, $$x_2 - x_1 \leq 2\sqrt{\frac{2\epsilon_0\epsilon_S N_a V_J}{q(N_a + N_D)N_D}} \quad (3)$$

$V_J$ is related to $(X_2-X_1)$ by the following expression which can be obtained from any standard reference on semiconductor device physics as well as equation (3):

$$V_J = \frac{kT}{q} \ln \frac{N_a N_D}{n_i^2} = \frac{kT}{q} \ln \left[ \frac{N_a}{n_i^2} \left( \frac{D}{X_2 - X_1} - N_a \right) \right] \quad (4)$$

where
k is Boltzmann's constant,
T is the temperature, and
$n_i$ is the semiconductor intrinsic carrier concentration.

It can be seen that $V_J$ slowly varies with respect to $(X_2-X_1)$ and therefore can be determined by assuming an approximate value of $(X_2-X_1)$.

Referring to region 1, for it to be completely depleted, $$X_S \cong (X_1 - X_{N1}) \tag{5}$$

with $$X_S = \sqrt{\frac{2\epsilon_0\epsilon_s(|V_{sxc}| + 2\phi)}{qN_a}} \text{ at } X_S = (X_1 - X_{N1})$$

where
$\phi$ = Fermi potential of the semiconductor bulk.

Since region 2 is also depleted, from charge neutrality consideration, $$N_a X_{N1} = N_D(X_2 - X_1)/2 \tag{6}$$

solving for $|V_{sxc}|$ from the above three expressions:

$$|V_{sxc}| = \frac{qN_a}{8\epsilon_0\epsilon_s}((X_2 + X_1) - \frac{D}{N_a})^2 - 2\phi \tag{7}$$

Figure 2:
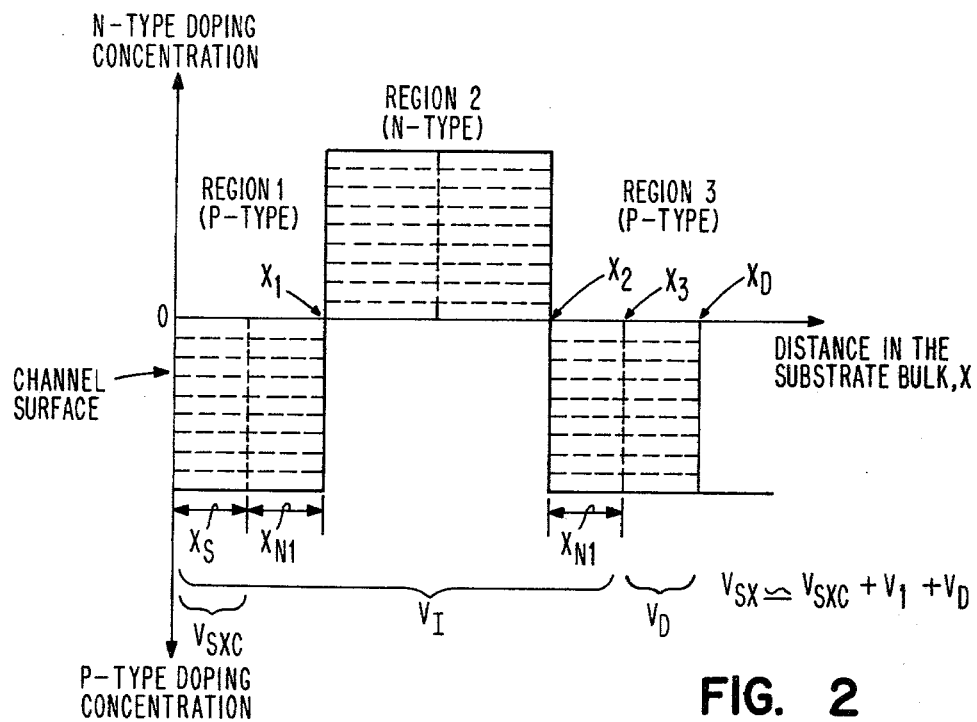
FIG. 2 is a doping profile of the structure along section X—X' of FIG. 1A but rotated 90° showing the depleted regions therein.

FIG. 2 essentially shows the details of FIG. 1B when regions 1, 2 and 3 are depleted. $|V_{sxc}|$, $V_I$ and $V_D$ are voltages across depleted areas in regions 1, 2, and 3 as shown, such that their sum total is approximately equal to substrate to source bias voltage, $V_{sx}$.

This completes the analysis that determines the critical conditions for depletion. Next the various voltage terms that make up the substrate bias and lead to an expression for the improved substrate sensitivity will be developed.

From the relationship between $X_s$ and $|V_{sxc}|$, the voltage drop across $X_s$ in region 1 due to the charges in $X_s$ is:

$$|V_{sxc}| = \frac{qN_a}{2\epsilon_0\epsilon_s} X_s^2 - 2\phi \tag{8}$$

The electronic field E in the depletion regions in FIG. 2 (also see FIG. 1A) from the channel surface to $X_3$ in excess of the built-in field is related to charges in the region $(X_D - X_3)$, by Gauss' Law:

$$E = \frac{(X_D - X_3) qN_a}{\epsilon_0\epsilon_s} \tag{9}$$

Thus, the voltage $V_I$ due to the charges between $X_3$ and $X_D$ in region 3 is given by:

$$|V_I| = EX_3 = \frac{(X_D - X_3)X_3}{\epsilon_0\epsilon_s} qN_a \tag{10}$$

But the depletion layer $(X_D - X_3)$ is caused by voltage $V_D$ so that:

$$|V_D| = \frac{(X_D - X_3)^2 qN_a}{2\epsilon_0\epsilon_s} \tag{11}$$

At threshold condition, it can be seen that:

$$V_T = V_{FB} + 2\phi + q\frac{N_a}{C_{ox}}(X_s + X_D - X_3) \tag{12}$$

where
$V_{FB}$ = Flatband voltage of the device, and
$C_{ox}$ = Gate insulator capacitance per unit area.

Manipulating the above expression and using the approximation:

$$V_{sx} \approx V_{sxc} + V_I + V_D, \tag{13}$$

the expression for threshold voltage is given by:

$$V_T = V_{FB} + 2\phi + \tag{14}$$
$$q\frac{N_a}{C_{ox}}\left[-\frac{D}{N_a} + \sqrt{\frac{2\epsilon_0\epsilon_s}{qN_a}(V_{sx} + 2\phi) + (X_1 + X_2)\frac{D}{N_a}}\right]$$

for $$(X_2 - X_1) \leq 2\sqrt{\frac{2\epsilon_0\epsilon_s N_a V_J}{q(N_a + N_D)N_D}} \tag{15}$$

and $$V_{sx} \geq V_{sxc} = q\frac{N_a}{8\epsilon_0\epsilon_s}\left[(X_2 + X_1) - \frac{D}{N_a}\right]^2 - 2\phi \tag{16}$$

Note that in equation 14, if D=0, $$V_T = V_{FB} + 2\phi + \frac{1}{C_{ox}}\sqrt{2q\epsilon_0\epsilon_s N_a(V_{sx} + 2\phi)} \tag{17}$$

the classical threshold voltage equation found in any standard reference on semiconductor device physics.

If a depletion device is desired, an additional shallow ion implant of appropriate dosage and energy can be used to shift the threshold voltage by an amount $V_{DOSE}$. Since this added implant is shallow, it does not effect the substrate sensitivity improvements obtained by the deep ion implant.

The device substrate sensitivity is given by differentiating equation 14:

$$\frac{dV_T}{dV_{sx}} = \frac{\epsilon_0\epsilon_s}{C_{ox}\sqrt{\frac{2\epsilon_0\epsilon_s}{qN_a}(V_{sx} + 2\phi) + (X_1 + X_2)\frac{D}{N_a}}} \tag{18}$$

This equation 18 represents the critical relationship between the dosage D, the upper bound $X_1$, and the lower bound $X_2$ for the buried channel 10 in a substrate 2 of FIG. 1A, having a given background doping concentration $N_a$, to achieve the desired threshold voltage sensitivity $dV_T/dV_{sx}$.

If D=0, the substrate sensitivity of the state of the art devices are given, i.e.

$$\frac{dV_T}{dV_{sx}} = \frac{\epsilon_0\epsilon_s}{C_{ox}\sqrt{\frac{2\epsilon_0\epsilon_s}{qN_a}(V_{sx} + 2\phi)}} \tag{19}$$

Comparisons of equations 18 and 19 clearly shows an improvement in substrate sensitivity of equation 18 due to the presence of the deep ion implant term $$\left([X_1 + X_2]\frac{D}{N_a}\right).$$

To further explain, FIG. 3 illustrates a graphical representation of the relationship between the substrate sensitivity in millivolts per volt versus the deep implant dosage for phosphorous ions and various implant energies ranging from 200 to 1000 kev, with $X_1$ ranging from 850 Å to 9213 Å, and $X_2$ ranging from 2850 Å to 13,588 Å. The designer selects that quantity represented as the ordinate "substrate sensitivity" in the graph of FIG. 3 and draws a horizontal line intersecting one or more of the curves therein. Each curve represents a different ion-implantation energy for phosphorous ions implanted through the channel region to form the buried layer 10 discussed above. The proper curve is selected in accordance with the available energies for the designer's implantation apparatus and the corresponding dosage for the phosphorous ions is then given by the value of the abscissa.

Figure 4:
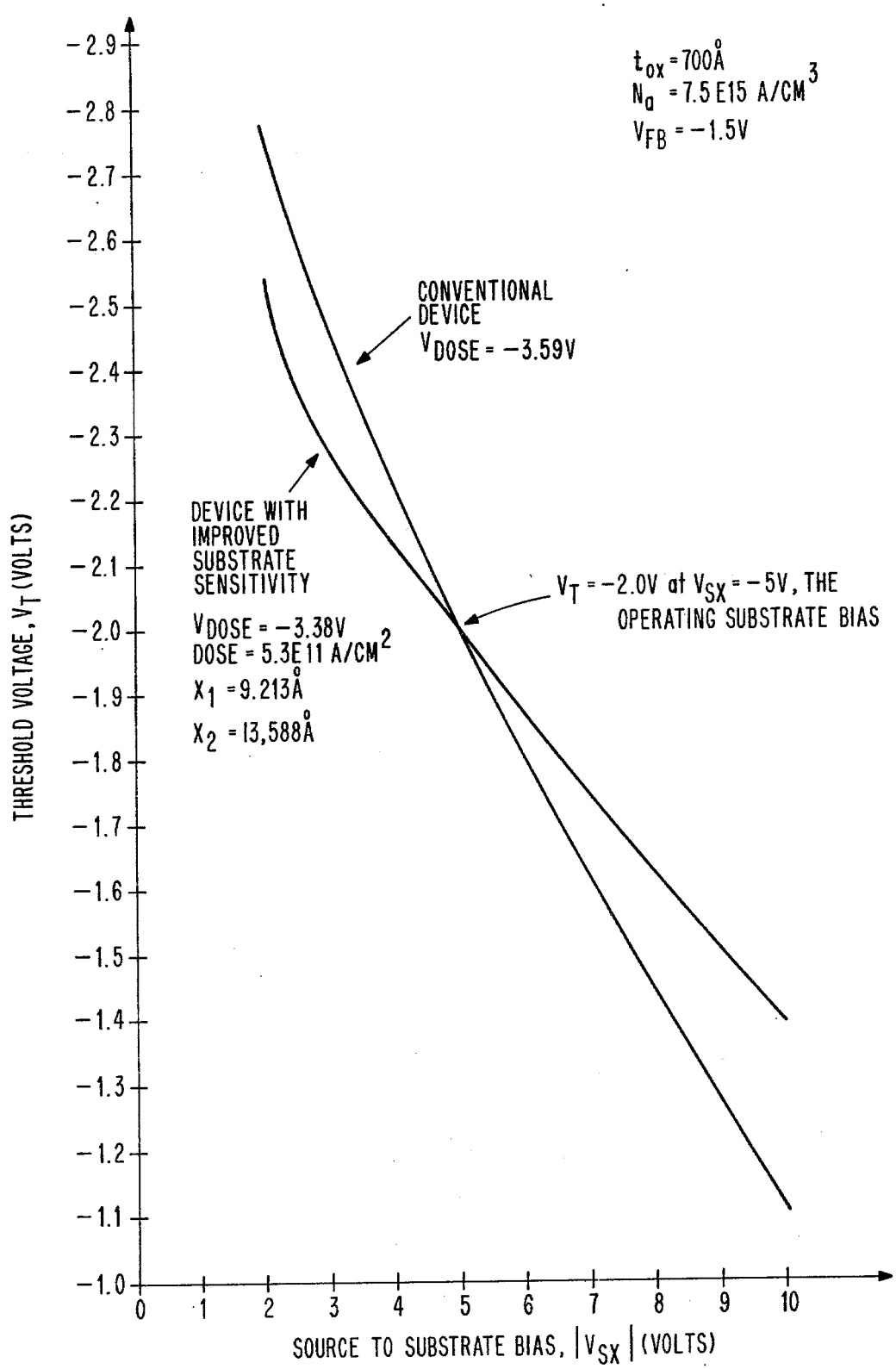
FIG. 4 is a graphical representation of the threshold voltage $V_T$ as a function of the source to substrate voltage $|V_{SX}|$ for a conventional device and a device made in accordance with the invention.

An example of a depletion device containing the invention is formed with a gate oxide 7 of 700 Å thickness ($t_{ox}$), a background doping concentration $N_a$ of $7.5 \times 10^{15}$ atoms/cm$^3$, a $V_{FB}$ of $-1.5$ volts, a $V_{DOSE}$ of $-3.38$ volts, an implant dose of $5.3 \times 10^{11}$ atoms/cm$^2$, and implantation thickness for the upper boundary $X_1$ of the buried layer of 9200 Å and for the lower boundary $X_2$ of 13,580 Å. The plot of the resulting threshold voltage as a function of the source to substrate voltage is compared to the corresponding threshold voltage as a function of the source to substrate voltage for a conventional device in FIG. 4. It is seen that the device formed in accordance with the invention has a smaller slope or rate of change of the threshold voltage with respect to the source to substrate voltage, thereby indicating that given changes in the magnitude of the source to substrate voltage will result in smaller changes in the threshold voltage for the device made in accordance with the subject invention.

Figure 5:
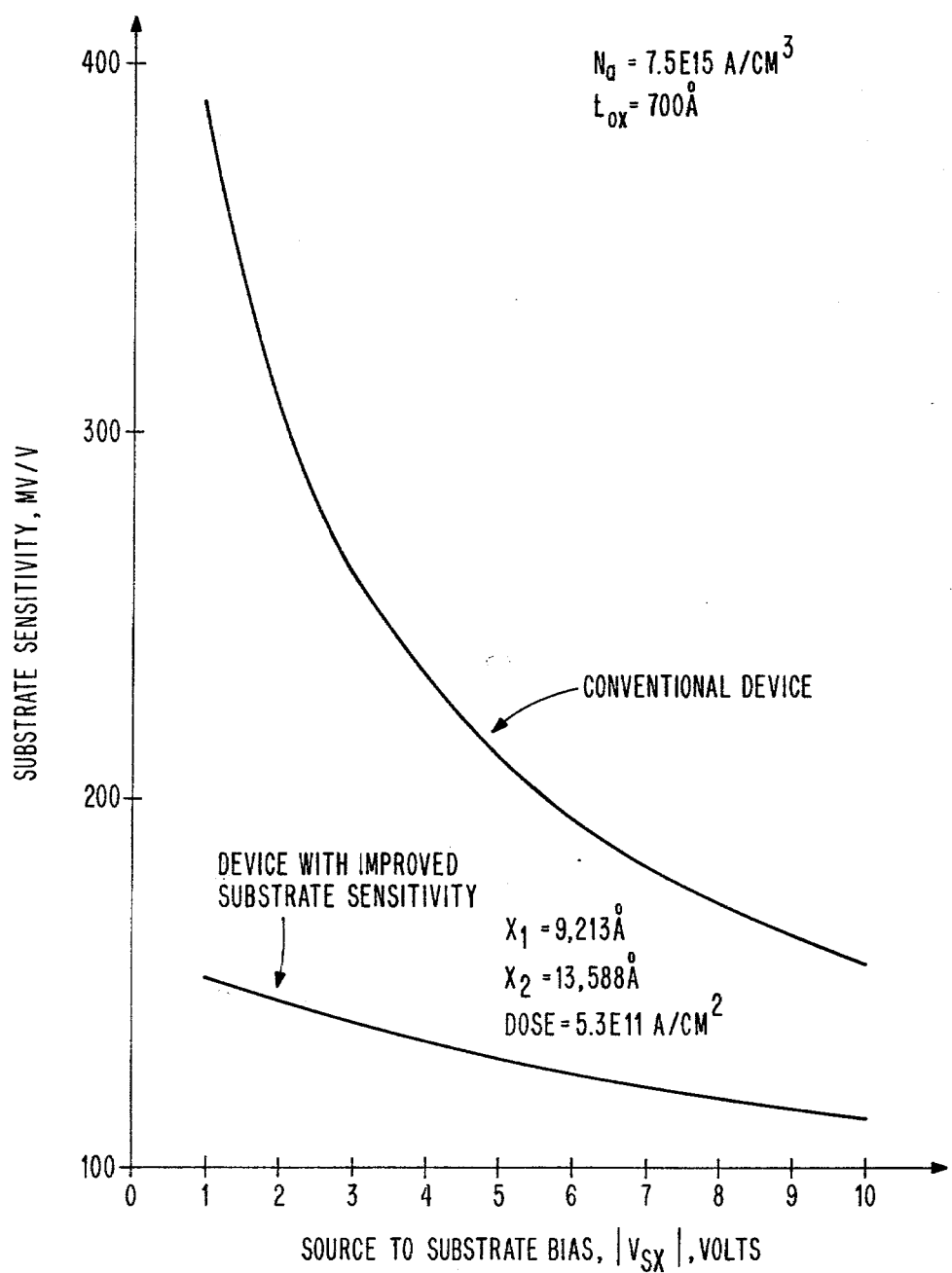
FIG. 5 is a graphical representation of the relationship between the substrate sensitivity in millivolts per volt as a function of the source to substrate voltage $|V_{SX}|$ for the conventional device and for the inventive device.

FIG. 5 illustrates substrate sensitivity in millivolts per volt as a function of source to substrate bias for the improved device with the parameters discussed in the previous paragraph compared to a conventional device. It is seen that there is a marked reduction in the substrate sensitivity for the device made in accordance with the subject invention as compared with that for a conventional device.

Figure 6A:
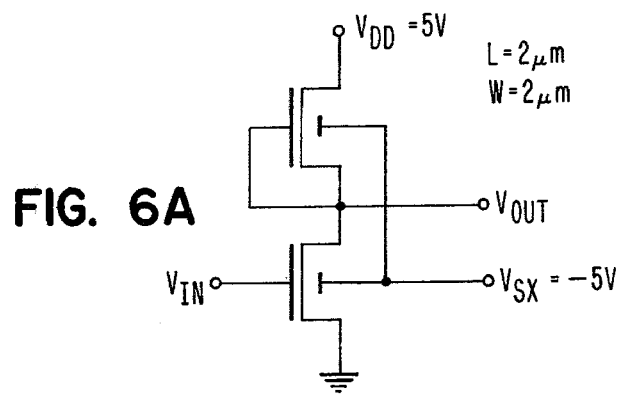
FIG. 6A shows a generalized MOSFET inverter circuit.
Figure 6B:
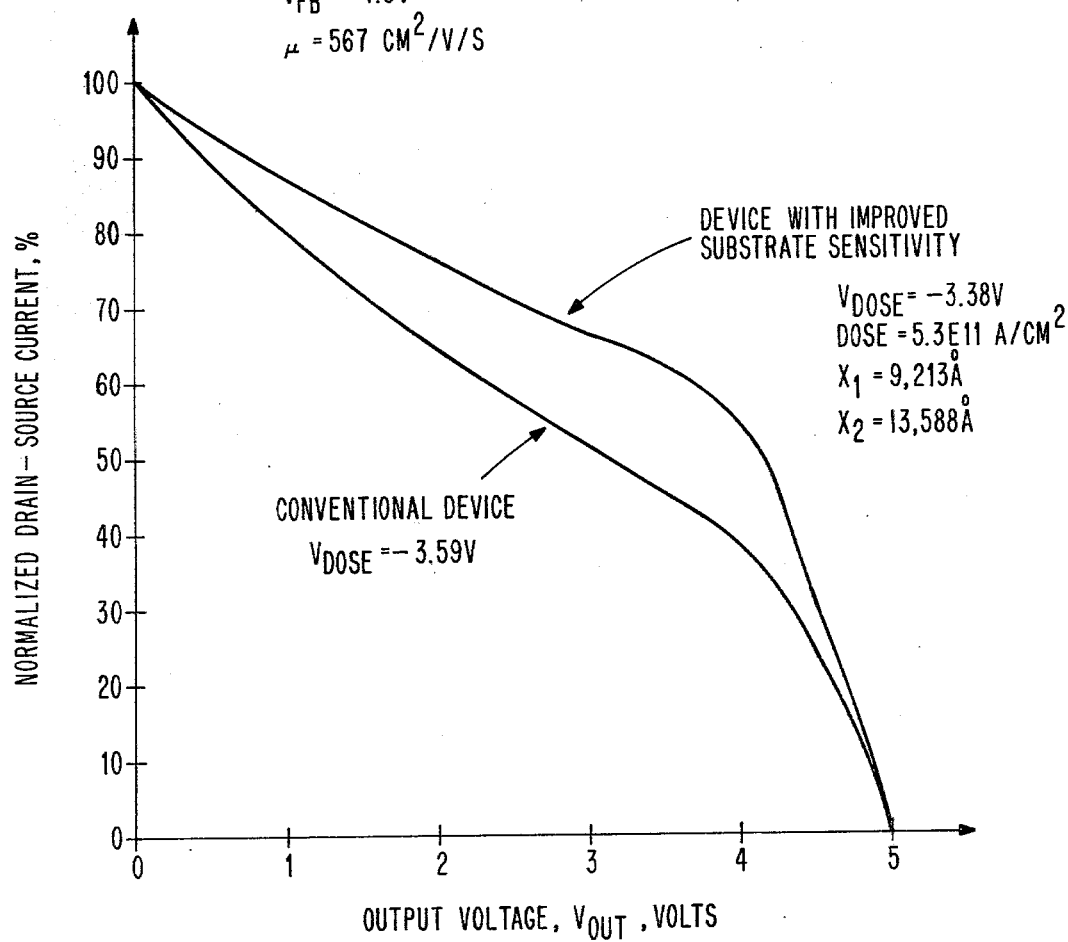
FIG. 6B is a graphical representation of the relationship between the normalized drain to source current and the output voltage using the MOSFET of FIG. 6A showing the improvement in current driving capability obtained by the invention.

A simple MOSFET inverter can be formed with a self biased depletion mode load device and an enhancement mode active device as is shown in FIGS. 6A and 6B which, by employing the structure of the subject invention for the load device, yields a substantially increased drain to source current driving capability during switching over that for the conventional device as shown in FIG. 6B.

Although the preferred method for introducing an insulating layer was by ion-implantation, the invention is applicable to any other method for forming a buried insulating layer between the source and drain. For example, a multilayered silicon epitaxy-insulator sandwich structure could be used to form the channel region of an FET device in accordance with this invention.

It is recognized that the implanted layer 10 can have its concentration contour adjusted by a plurality of ion-implant steps to achieve a more optimum profile.

While the invention has been particularly shown and described with reference to the preferred embodiments thereof, it will be understood by those skilled in the art that the foregoing and other changes in form and details may be made therein without departing from the spirit and scope of the invention.

What is claimed:

1. A method for reducing the sensitivity of the threshold voltage to the substrate voltage in a field effect transistor having source and drain regions of N conductivity type with a channel therebetween, in a silicon substrate of P conductivity type, with a gate lying above the channel, wherein the improvement comprises the steps of:

forming said substrate with a background doping concentration of $N_a$ conductivity enhancing dopant atoms per cubic centimeter, wherein $N_a$ is approximately $7.5 \times 10^{15}$ conductivity enhancing dopant atoms per cm$^3$;

selecting a sensitivity $dV_t/dV_{sx}$ of the threshold voltage to the substrate voltage;

selecting a substrate-to-source voltage bias $V_{sx}$;

determining the location and dopant concentration D of a phosphorous ion-implanted layer of said N conductivity type in said channel region having an upper PN junction at a distance $X_1$ beneath the surface of said substrate and a lower PN junction at a distance $X_2$ beneath said surface, so that the respective depletion regions of said two PN junctions merge at said selected value of $V_{sx}$ to impart said selected sensitivity to the resultant transistor, wherein the relationship of $X_1$, $X_2$, D, $N_a$ and $dV_t/dV_{sx}$ is expressed by $$\frac{dV_T}{dV_{sx}} = \frac{\epsilon_0 \epsilon_s}{C_{ox}\sqrt{\frac{2\epsilon_0\epsilon_s}{qN_a}(V_{sx} + 2\phi) + (X_1 + X_2)\frac{D}{N_a}}};$$

ion-implanting said phosphorous ion-implanted layer at an ion implant energy of between 200 keV and 1000 keV at a dosage of between $6 \times 10^{11}$ atoms per cm$^2$ and $7 \times 10^{11}$ atoms per cm$^2$ to reduce said sensitivity of the threshold voltage to the substrate voltage by increasing the distance between mirrored charges in the substrate and in the gate through said merger of the depletion regions of said two PN junctions.

* * * * *